United States Patent
Kim et al.

(10) Patent No.: US 11,114,999 B2
(45) Date of Patent: Sep. 7, 2021

(54) FILTER INCLUDING ACOUSTIC WAVE RESONATOR

(71) Applicant: Samsung Electro-Mechanics Co., Ltd., Suwon-si (KR)

(72) Inventors: Sung Tae Kim, Suwon-si (KR); Jung Woo Sung, Suwon-si (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 0 days.

(21) Appl. No.: 16/541,222

(22) Filed: Aug. 15, 2019

(65) Prior Publication Data
US 2020/0366271 A1    Nov. 19, 2020

(30) Foreign Application Priority Data

May 14, 2019    (KR) .................. 10-2019-0056273

(51) Int. Cl.
*H03H 9/60*    (2006.01)
*H03H 9/54*    (2006.01)

(52) U.S. Cl.
CPC ............ *H03H 9/605* (2013.01); *H03H 9/542* (2013.01)

(58) Field of Classification Search
CPC .............................. H03H 9/605; H03H 9/542
See application file for complete search history.

(56) References Cited

U.S. PATENT DOCUMENTS

| | | | |
|---|---|---|---|
| 6,262,637 B1 | 7/2001 | Bradley et al. | |
| 2007/0046394 A1* | 3/2007 | Inoue | H03H 9/02157 333/133 |
| 2008/0081398 A1 | 4/2008 | Lee et al. | |
| 2011/0090026 A1* | 4/2011 | Nakahashi | H03H 9/6409 333/195 |
| 2012/0293277 A1* | 11/2012 | Hara | H03H 9/725 333/133 |
| 2016/0218696 A1 | 7/2016 | Nosaka | |
| 2017/0093372 A1 | 3/2017 | Yokoyama | |
| 2020/0021271 A1* | 1/2020 | Plesski | H03H 9/54 |
| 2020/0287523 A1* | 9/2020 | Urata | H03H 9/6483 |

FOREIGN PATENT DOCUMENTS

| | | |
|---|---|---|
| JP | 2002-232264 A | 8/2002 |
| KR | 10-1793055 B1 | 11/2017 |
| KR | 10-1805673 B1 | 12/2017 |

OTHER PUBLICATIONS

"5G Spectrum Public Policy Position", *Huawei* Technologies Co., Ltd., 2017 (pp. 1-20).

* cited by examiner

*Primary Examiner* — Samuel S Outten
(74) *Attorney, Agent, or Firm* — NSIP Law

(57) ABSTRACT

A filter includes: series resonators disposed between an input terminal and an output terminal; and shunt resonators disposed at different nodes between the input terminal and the output terminal, wherein a resonance frequency and an antiresonance frequency of at least one series resonator among the series resonators are respectively located within a reference frequency range of a resonance frequency and an antiresonance frequency of the shunt resonators.

16 Claims, 14 Drawing Sheets

FILTER INCLUDING ACOUSTIC WAVE RESONATOR

CROSS-REFERENCE TO RELATED APPLICATIONS

This application claims the benefit under 35 U.S.C. § 119(a) of Korean Patent Application No. 10-2019-0056273 filed on May 14, 2019 in the Korean Intellectual Property Office, the entire disclosure of which is incorporated herein by reference for all purposes.

BACKGROUND

1. Field

The following description relates to a filter including an acoustic resonator.

2. Description of Related Art

As mobile communications devices, chemical and biological testing devices, and the like have recently been rapidly developed, demand for compact and lightweight filters, oscillators, resonant elements, and acoustic resonant mass sensors used for such devices has also grown.

A film bulk acoustic resonator (FBAR) is known as a device for implementing such a compact and lightweight filters, oscillators, resonant elements, and acoustic resonance mass sensors. An FBAR has the advantages that mass production of FBARs is possible at minimal cost, and an FBAR may be manufactured to have a significantly small size. Moreover, the FBAR may be designed to provide a filter having a high quality factor (Q) value, which is a main characteristic of a filter, and the FBAR may be used even in a frequency band of several GHz.

In general, the FBAR is formed to have a structure including a resonant portion in which a first electrode, a piezoelectric body, and a second electrode are sequentially stacked on a substrate. In an operation of the FBAR, first, an electric field is induced in a piezoelectric layer by electrical energy applied to first and second electrodes, and a piezoelectric phenomenon is generated in the piezoelectric layer by the induced electric field, thereby causing a resonant portion to vibrate in a predetermined direction. As a result, a bulk acoustic wave is generated in a direction that is the same as a vibration direction, thereby causing resonance.

SUMMARY

This Summary is provided to introduce a selection of concepts in simplified form that are further described below in the Detailed Description. This Summary is not intended to identify key features or essential features of the claimed subject matter, nor is it intended to be used as an aid in determining the scope of the claimed subject matter.

In one general aspect, a filter includes: series resonators disposed between an input terminal and an output terminal; and shunt resonators disposed at different nodes between the input terminal and the output terminal, wherein a resonance frequency and an antiresonance frequency of at least one series resonator among the series resonators are respectively located within a reference frequency range of a resonance frequency and an antiresonance frequency of the shunt resonators.

The resonance frequency of the at least one series resonator may be located between the resonance frequency of the shunt resonators and a lower limit frequency of the filter.

A difference between the resonance frequency and the antiresonance frequency of the at least one series resonator may be equal to a difference between the resonance frequency and the antiresonance frequency of the shunt resonators.

The filter may further include a trimming inductor connected to the at least one series resonator in parallel.

The antiresonance frequency of the at least one series resonator may be located outside of a passband of the filter.

The antiresonance frequency of the at least one series resonator may be higher than the antiresonance frequency of a remainder of series resonators among the series resonators.

A lower limit frequency of the filter may be located between the resonance frequency and the antiresonance frequency of the shunt resonators. An upper limit frequency of the filter may be located between a resonance frequency and an antiresonance frequency of another series resonator among the series resonators.

The filter may have a passband of 4.4 GHz to 5.0 GHz.

The at least one series resonator may constitute less than an all of the series resonators.

In another general aspect, a filter includes: series resonators disposed between an input terminal and an output terminal; and shunt resonators disposed at different nodes between the input terminal and the output terminal, wherein a resonance frequency and an antiresonance frequency of at least one shunt resonator among the shunt resonators are respectively located within a reference frequency range of a resonance frequency and an antiresonance frequency of the series resonators.

The resonance frequency of the at least one shunt resonator may be located between a center frequency of the filter and a resonance frequency of the series resonators.

A difference between the resonance frequency and the antiresonance frequency of the series resonators may be equal to a difference between the resonance frequency and the antiresonance frequency of the at least one shunt resonator.

The filter may further include: at least one trimming inductor connected to the at least one shunt resonator in series.

The resonance frequency of the at least one shunt resonator may be located outside of a passband of the filter.

The resonance frequency of the at least one shunt may be lower than a resonance frequency of the series resonators.

A lower limit frequency of the filter may be located between a resonance frequency and an antiresonance frequency of another shunt resonator among the shunt resonators. An upper limit frequency of the filter may be located between the resonance frequency and the antiresonance frequency of the series resonators.

The filter may have a bandwidth of 400 MHz to 800 MHz.

The at least one shunt resonator may constitute less than an all of the shunt resonators.

Other features and aspects will be apparent from the following detailed description, the drawings, and the claims.

BRIEF DESCRIPTION OF DRAWINGS

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

Figure 1:
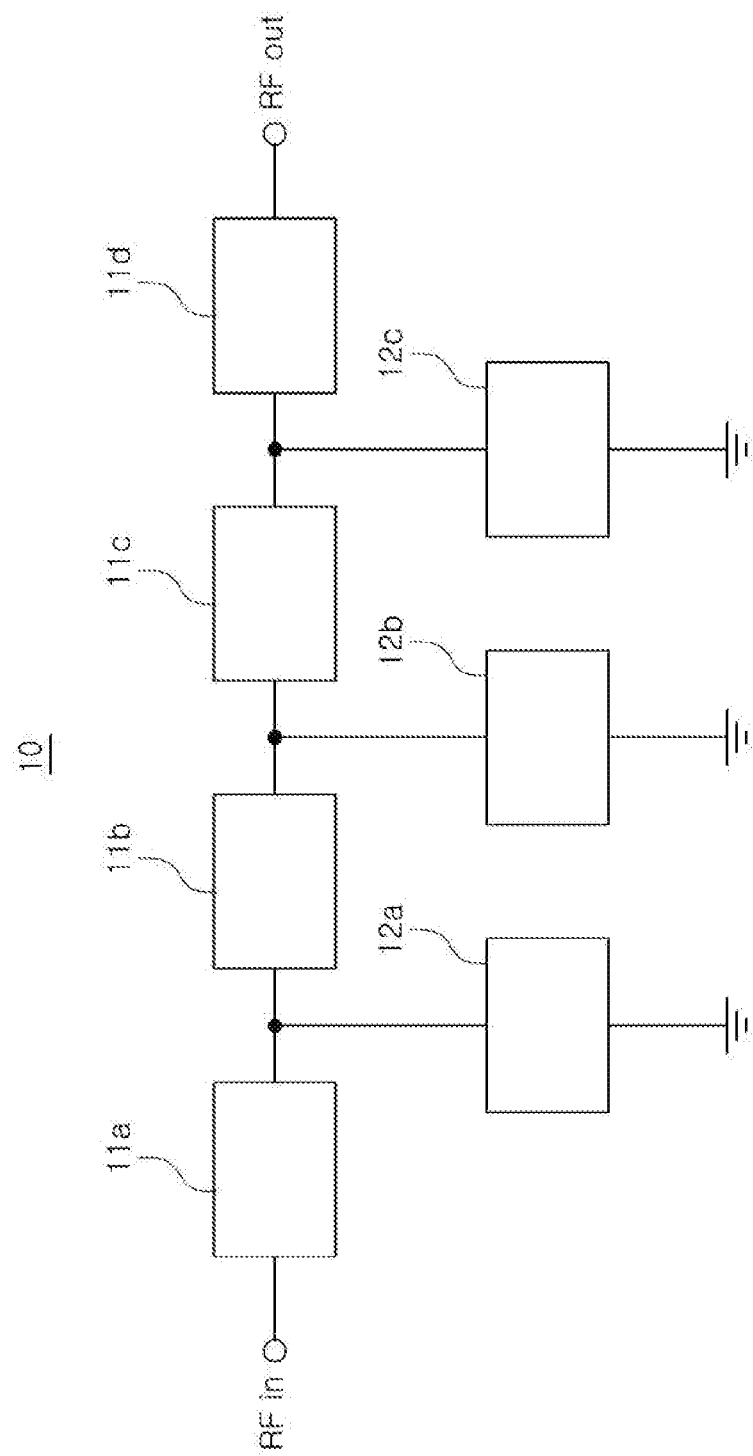
FIG. 1 is a circuit diagram illustrating a filter, according to an embodiment.

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known in the art may be omitted for increased clarity and conciseness.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

Herein, it is noted that use of the term "may" with respect to an example or embodiment, e.g., as to what an example or embodiment may include or implement, means that at least one example or embodiment exists in which such a feature is included or implemented while all examples and embodiments are not limited thereto.

Throughout the specification, when an element, such as a layer, region, or substrate, is described as being "on," "connected to," or "coupled to" another element, it may be directly "on," "connected to," or "coupled to" the other element, or there may be one or more other elements intervening therebetween. In contrast, when an element is described as being "directly on," "directly connected to," or "directly coupled to" another element, there can be no other elements intervening therebetween.

As used herein, the term "and/or" includes any one and any combination of any two or more of the associated listed items.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

Spatially relative terms such as "above," "upper," "below," and "lower" may be used herein for ease of description to describe one element's relationship to another element as shown in the figures. Such spatially relative terms are intended to encompass different orientations of the device in use or operation in addition to the orientation depicted in the figures. For example, if the device in the figures is turned over, an element described as being "above" or "upper" relative to another element will then be "below" or "lower" relative to the other element. Thus, the term "above" encompasses both the above and below orientations depending on the spatial orientation of the device. The device may also be oriented in other ways (for example, rotated 90 degrees or at other orientations), and the spatially relative terms used herein are to be interpreted accordingly.

The terminology used herein is for describing various examples only, and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

Due to manufacturing techniques and/or tolerances, variations of the shapes shown in the drawings may occur. Thus, the examples described herein are not limited to the specific shapes shown in the drawings, but include changes in shape that occur during manufacturing.

The features of the examples described herein may be combined in various ways as will be apparent after an understanding of the disclosure of this application. Further, although the examples described herein have a variety of configurations, other configurations are possible as will be apparent after an understanding of the disclosure of this application.

FIG. 1 is an exemplary circuit diagram illustrating a filter 10, according to an embodiment.

Referring to FIG. 1, the filter 10 may include series parts 11a, 11b, 11c, and 11d, as well as shunt parts 12a, 12b, and 12c disposed between the series parts 11a, 11b, 11c, and 11d and the ground. As illustrated in FIG. 1, the filter 10 may have a ladder-type filter structure, or a lattice-type filter structure.

The series parts 11a, 11b, 11c, and 11d may be arranged in series between an input terminal RFin, to which an input signal is input, and an output terminal RFout, from which an output signal is output. The shunt parts 12a, 12b, and 12c may be disposed between different nodes and grounds between the input terminal RFin and the output terminal RFout. The shunt parts 12a, 12b, and 12c may be disposed between nodes and grounds between the series parts 11a, 11b, 11c, and 11d. According to an embodiment, a shunt part may be disposed between the input terminal RFin and the ground, or between the output terminal RFout and the ground.

In FIG. 1, the filter is illustrated as having four series parts 11a, 11b, 11c, and 11d, as well as three shunt parts 12a, 12b, and 12c, but the number of series parts 11a, 11b, 11c, and 11d, as well as shunt parts 12a, 12b, and 12c may be changed. Each of the series parts 11a, 11b, 11c, and 11d, and each of the shunt parts 12a, 12b, and 12c may include at least one bulk-acoustic wave resonator.

Fifth generation (5G) communications are expected to connect more devices to each other efficiently with larger amounts of data and faster data transfer rates compared to conventional long term evolution (LTE) communications. 5G mobile communications are developing in a direction of using a frequency band of 24250 MHz to 52600 MHz corresponding to a millimeter wave (mmWave), and a frequency band of 450 MHz to 6000 MHz corresponding to sub-6 GHz.

The sub-6 GHz band is expected to be commercialized in a number of countries, due to the similarity of technology according to band proximity with the conventional 4G communications. Each of an n77 band (3300 MHz to 4200 MHz), an n78 band (3300 MHz to 3800 MHz), and an n79 band (4400 MHz to 5000 MHz) is defined as one among operating bands of the sub-6 GHz, and the n77 band (3300 MHz to 4200 MHz), the n78 band (3300 MHz to 3800 MHz), and the n79 band (4400 MHz to 5000 MHz) are expected to be used as a main band, due to the advantages of having a wide bandwidth.

However, in a bulk-acoustic wave resonator having excellent attenuation characteristics, since an interval between a resonance frequency and an antiresonance frequency is narrow, for example, 200 MHz, it is difficult to form a wide passband of 600 MHz or more. Thus, it may be difficult to apply such a bulk-acoustic wave resonator to 5G communications requiring broadband frequency characteristics.

Figure 2:
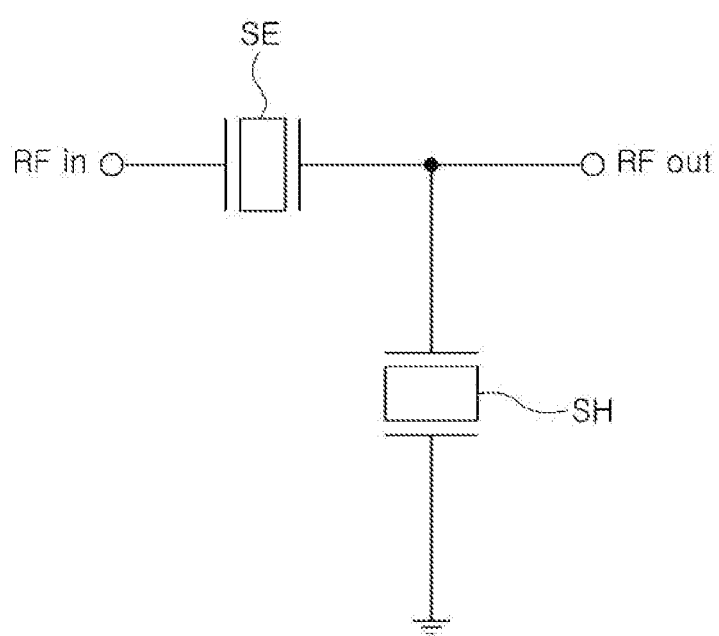
FIG. 2 is a circuit diagram of a filter including a bulk-acoustic wave resonator, according to an embodiment.

FIG. 2 is a circuit diagram of a filter 100 including a bulk-acoustic wave resonator.

Referring to FIG. 2, the filter 100 may include a series resonator SE disposed between an input terminal RFin and an output terminal RFout, as well as a shunt resonator SH disposed between the series resonator SE and the ground.

Figure 3A:
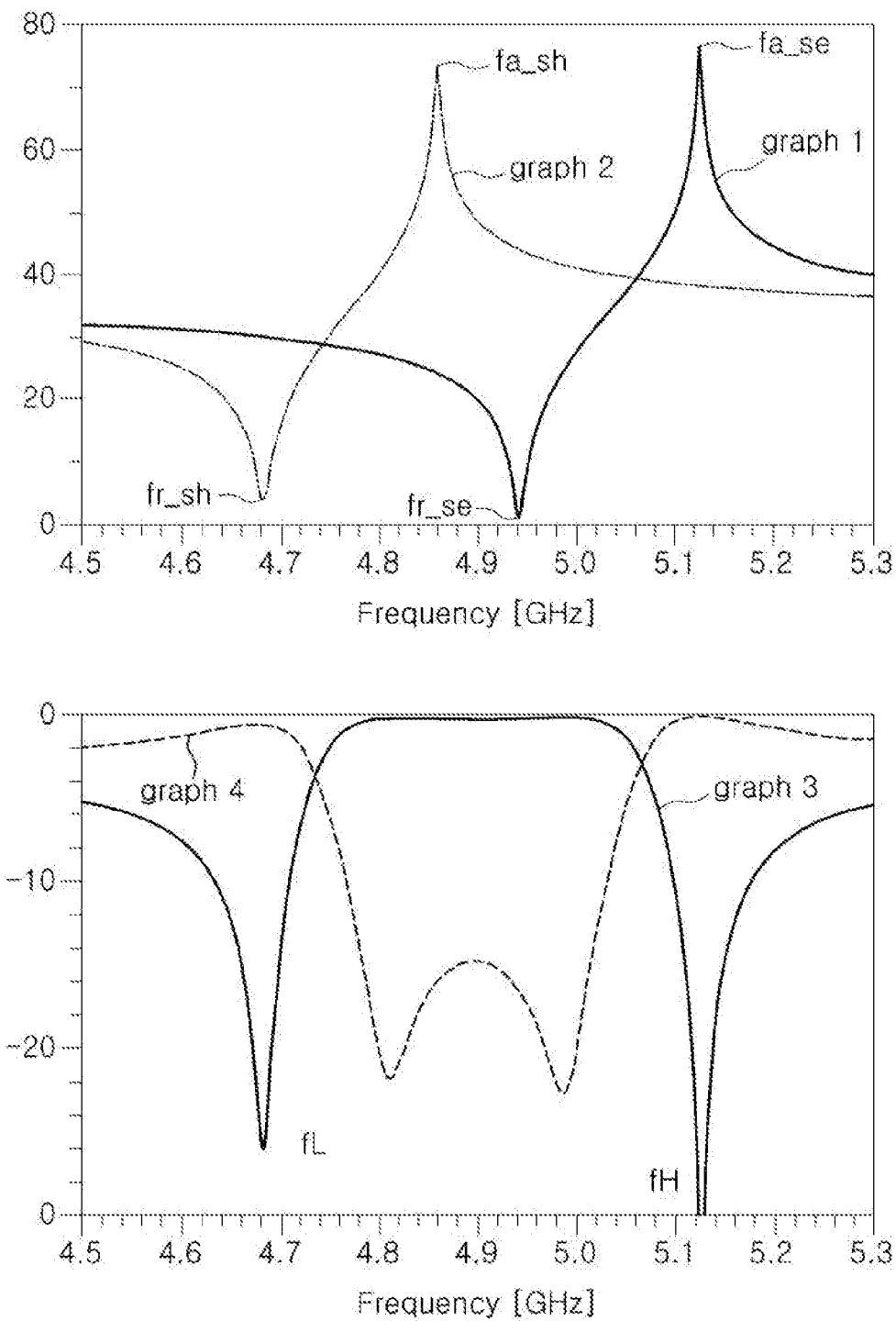
FIG. 3A illustrates a frequency response in an example in which the filter of FIG. 2 has a bandwidth of 200 MHz.
Figure 3B:
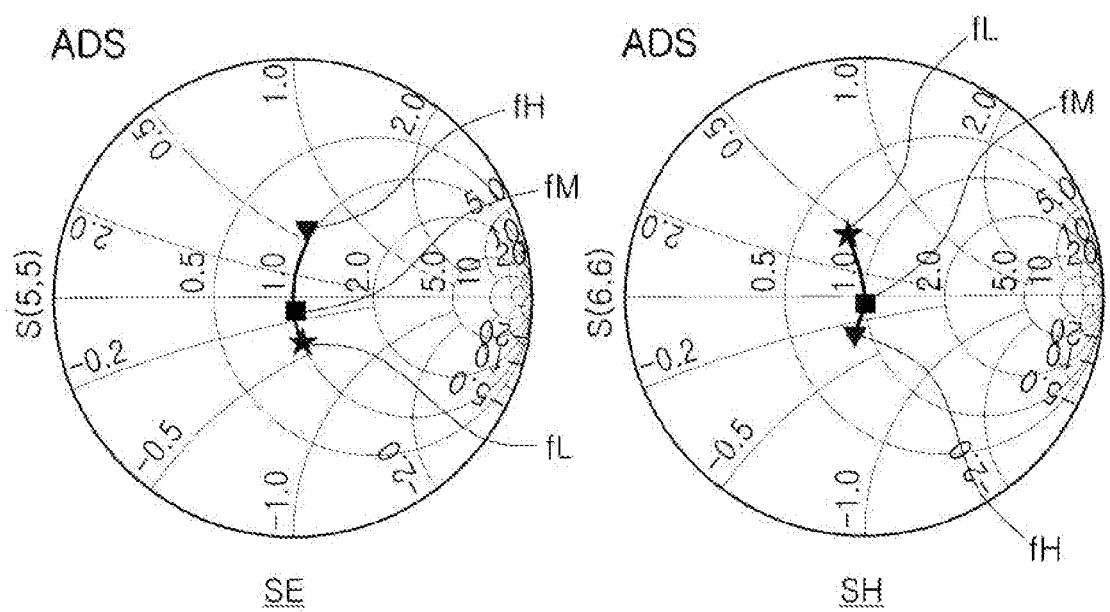
FIG. 3B is a Smith chart in the example in which the filter of FIG. 2 has a bandwidth of 200 MHz.
Figure 4A:
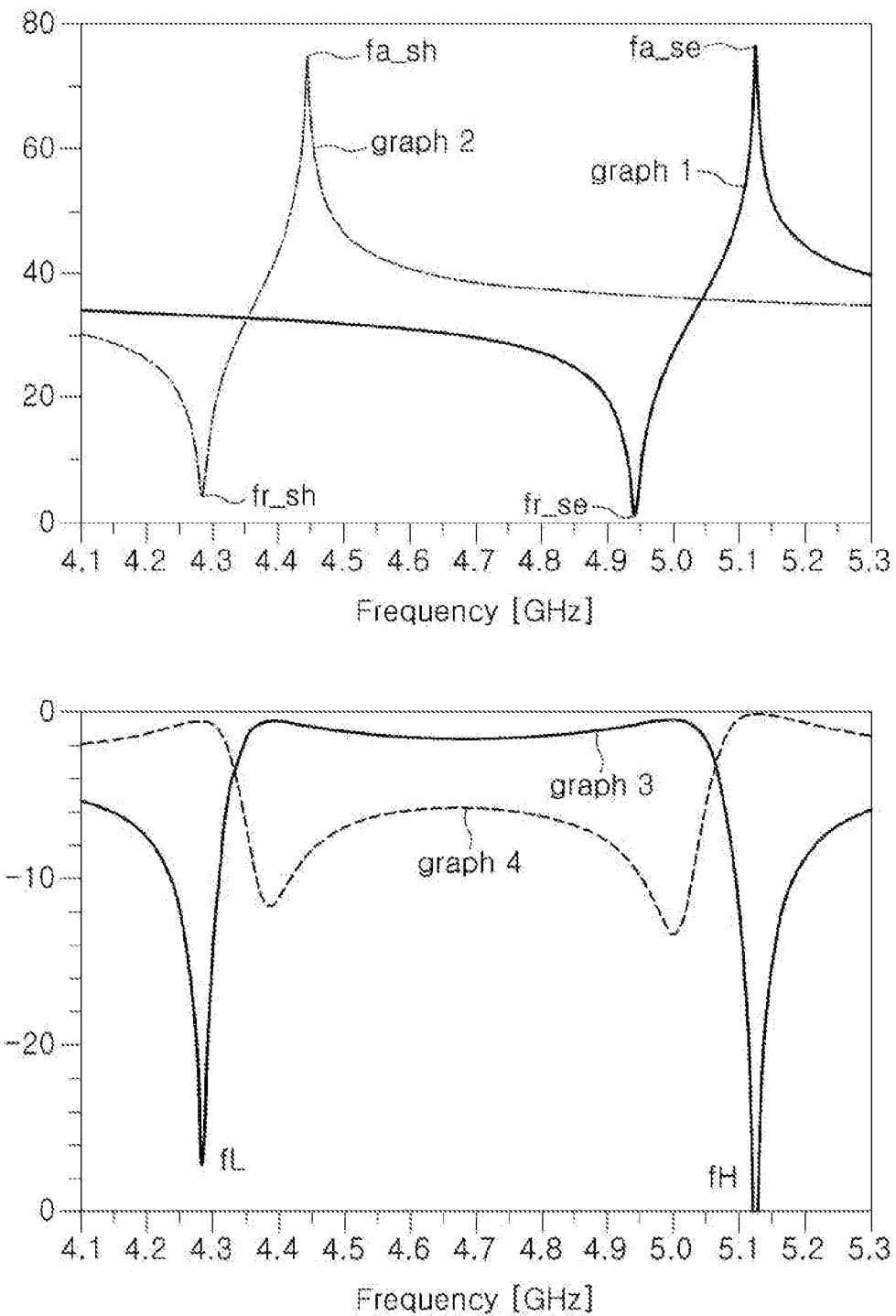
FIG. 4A illustrates a frequency response in an example in which the filter of FIG. 2 has a bandwidth of 600 MHz.
Figure 4B:
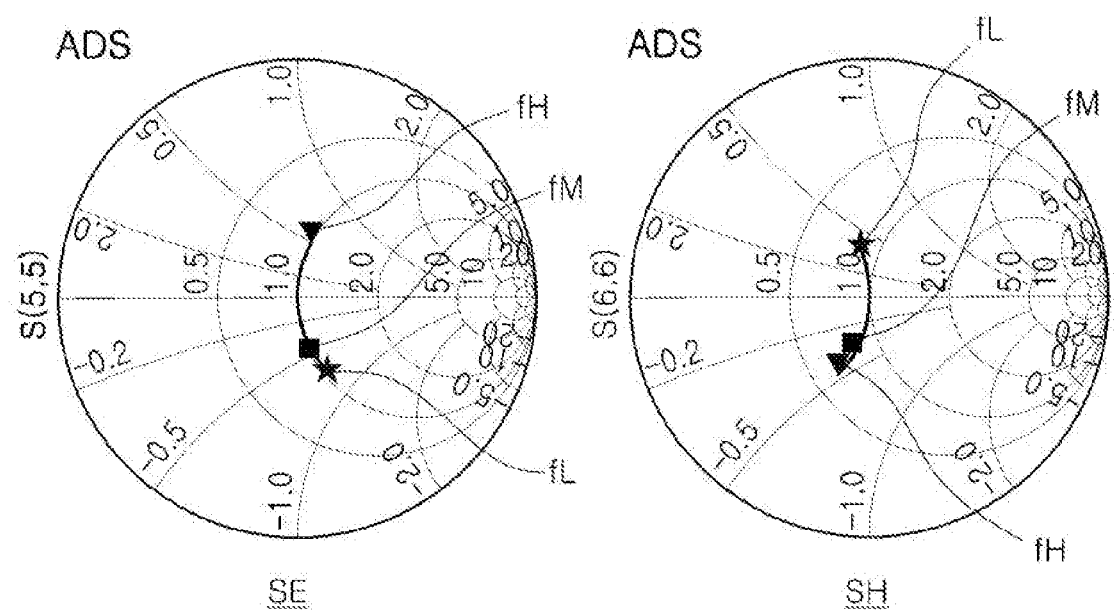
FIG. 4B is a Smith chart in the example in which the filter of FIG. 2 has a bandwidth of 600 MHz.

FIG. 3A illustrates a frequency response in an example in which the filter 100 of FIG. 2 has a bandwidth of 200 MHz. FIG. 3B is a Smith chart in the example in which the filter 100 of FIG. 2 has a bandwidth of 200 MHz. In addition, FIG. 4A illustrates a frequency response in an example in which the filter 100 of FIG. 2 has a bandwidth of 600 MHz. FIG. 4B is a Smith chart in the example in which the filter of FIG. 2 has a bandwidth of 600 MHz.

Referring to FIGS. 3A and 4A, a first graph (graph 1) illustrates a frequency response (Z, Impedance) of a series resonator SE, a second graph (graph 2) illustrates a frequency response (Z, Impedance) of a shunt resonator SH, and each of a third graph (graph 3) and a fourth graph (graph 4) illustrates insertion loss and return loss of the filter 100 including the series resonator SE and the shunt resonator SH.

A frequency response of the series resonator SE has a resonance frequency fr_SE and an antiresonance frequency fa_SE, while a frequency response of the shunt resonator SH has a resonance frequency fr_SH and an antiresonance frequency fa_SH. The antiresonance frequency fa_SE of the series resonator SE and the resonance frequency fr_SH of the shunt resonator SH are formed outside a passband of a filter. The resonance frequency fr_SE of the series resonator SE and the antiresonance frequency fa_SH of the shunt resonator SH are formed inside the passband of the filter. In this case, a lower limit frequency fL is located between the resonance frequency fr_SH and the antiresonance frequency fa_SH of the shunt resonator SH, and an upper limit frequency fH is located between the resonance frequency fr_SE and the antiresonance frequency fa_SE of the series resonator SE.

Referring to FIG. 3A, a lower limit frequency fL of a passband of the filter 100 is about 4.8 GHz, a center frequency fM of the filter 100 is about 4.9 GHz, and an upper limit frequency fH of the filter 100 is about 5.0 GHz. Referring to FIG. 4A, a lower limit frequency fL of a passband of the filter 100 is about 4.4 GHz, a center frequency fM of the filter 100 is about 4.7 GHz, and an upper limit frequency fH of the filter 100 is about 5.0 GHz.

In the Smith charts illustrated in FIGS. 3B and 4B, a lower portion of a middle line across the center of a circle acts as a capacitor component, and an upper portion acts as an inductance component.

Referring to FIG. 3B, lower limit frequencies fL of the series resonator SE and the shunt resonator SH are formed in directions symmetrical to each other and cancel each other, while upper limit frequencies fH of the series resonator SE and the shunt resonator SH are formed in directions symmetrical to each other and cancel each other. Additionally, a center frequency fM is located near the center of the circle. As an example, due to the center frequency fM being located near the center of the circle, the center frequency fM may provide return loss of 15 dB or more.

Referring to FIG. 4B, lower limit frequencies fL of the series resonator SE and the shunt resonator SH are formed in directions symmetrical to each other and cancel each other, and upper limit frequencies fH of the series resonator SE and the shunt resonator SH are formed in directions symmetrical to each other and cancel each other. However, the center frequency fM is spaced from the center of the circle by a predetermined distance and is located in a lower portion of the circle. As an example, due to the center frequency fM being spaced from the center of the circle by the predetermined distance and located in the lower portion of the circle, the center frequency fM may not provide sufficient return loss. Thus, referring to FIG. 4A, bandpass characteristics at the vicinity of the center frequency fM may be deteriorated. Thus, it is necessary to improve the deteriorated bandpass characteristics.

In FIG. 4B, the center frequency fM is located in a lower portion of the circle acting as a capacitor component. Thus, when an inductance component is provided to the center frequency fM, characteristics of return loss of a filter may be improved. In a bulk-acoustic wave resonator, an inductance component is provided between a resonance frequency and an antiresonance frequency. Thus, when an inductance component is provided between a resonance frequency and an antiresonance frequency of the bulk-acoustic wave resonator, a broadband filter using the bulk-acoustic wave resonator may be designed.

Figure 5A:
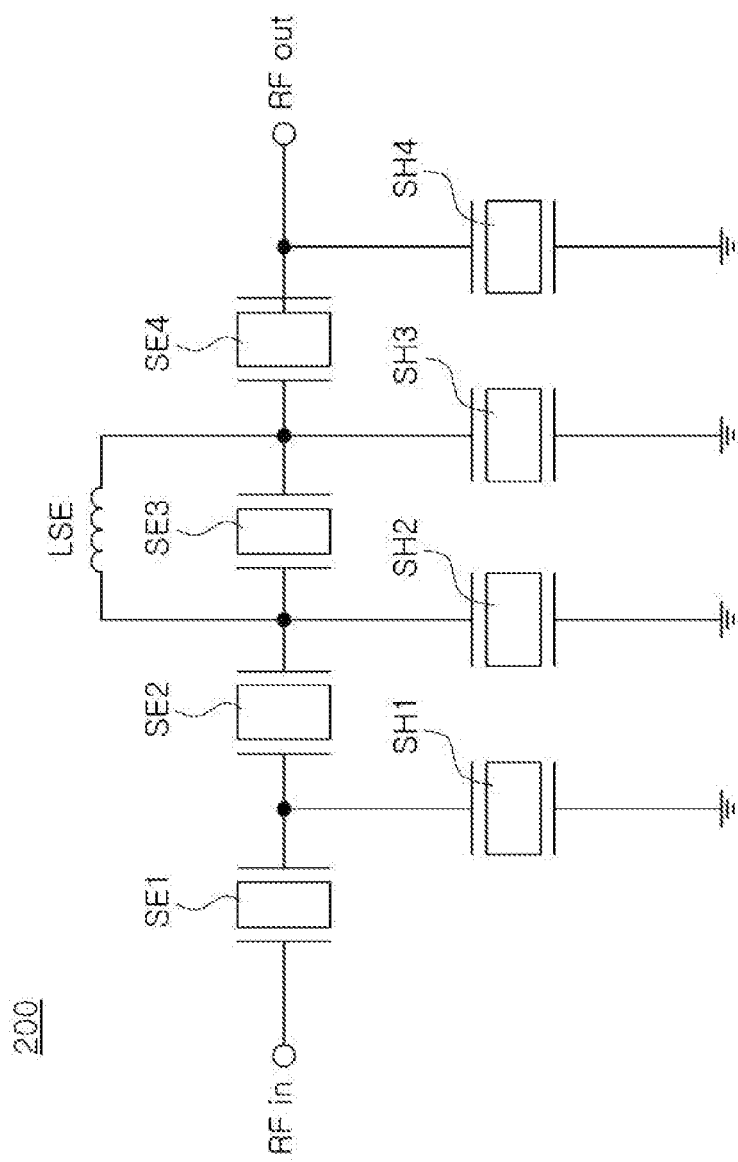
FIGS. 5A and 5B are circuit diagrams of filters, according to embodiments.
Figure 5B:
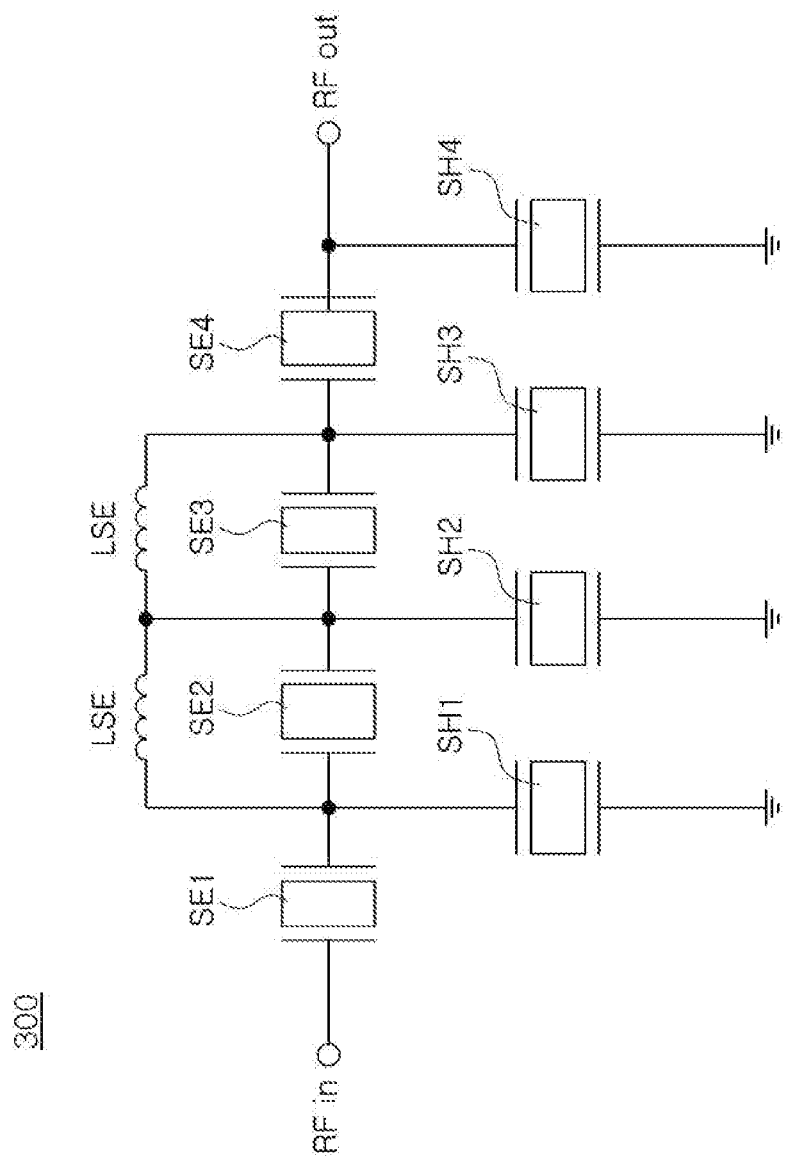

FIGS. 5A and 5B are circuit diagrams of a filters 200 and 300, respectively, according to embodiments. The filter 200 may have a bandwidth of 400 MHz to 800 MHz. As an example, the filters 200 and 300 may have a bandwidth of 600 MHz, an upper limit frequency of 4.4 GHZ, and a lower limit frequency of 5.0 GHz.

Referring to FIG. 5A, the filter 200 may include series resonators SE1 to SE4 and shunt resonators SH1 to SH4. The series resonators SE1 to SE4 correspond to a configuration included in different series parts of FIG. 1, the plurality of shunt resonators correspond to a configuration included in different shunt parts of the filter 10 of FIG. 1, and each of the resonators SE1 to SE4 and the shunt resonators SH1 to SH4 may be a bulk-acoustic wave resonator. A difference between a natural resonance frequency and a natural antiresonance frequency of each of the series resonators SE1 to SE4 may be equal to a difference between a natural resonance frequency and a natural antiresonance frequency of each of the shunt resonators SH1 to SH4.

The series resonators SE1 to SE4 may be disposed between the input terminal RFin and the output terminal RFout. As an example, the first series resonator SE1, the second series resonator SE2, the third series resonator SE3, and the fourth series resonator SE4 are connected to each other in series.

The shunt resonators SH1 to SH4 may be disposed between different nodes and grounds between the input terminal RFin and the output terminal RFout. As an example, the first shunt resonator SH1 may be disposed between a node and a ground between the first series resonator SE1 and the second series resonator SE2, the second shunt resonator SH2 may be disposed between a node and a ground between the second series resonator SE2 and the third series resonator SE3, the third shunt resonator SH3 may be disposed between a node and a ground between the third series resonator SE3 and the fourth series resonator SE4, and the fourth shunt resonator SH1 may be disposed between a node and a ground between the fourth series resonator SE4 and the output terminal RFout.

A portion (e.g., at least one) of the series resonators SE1 to SE4 provided in the filter 200 may have first frequency characteristics, while another portion of the series resonators SE1 to SE4 may have frequency characteristics different from the first frequency characteristics. The shunt resonators SH1 to SH4 may have second frequency characteristics. Hereinafter, for convenience of explanation, it is assumed that the first series resonator SE1, the second series resonator SE2, and the fourth series resonator SE4 have the first frequency characteristics, while the third series resonator SE3 has third frequency characteristics that are different from the first frequency characteristics.

The terms "frequency characteristics" may be understood as terms referring to a resonance frequency and an antiresonance frequency. As an example, a resonator having first frequency characteristics may have a first resonance frequency and a first antiresonance frequency, a resonator having second frequency characteristics may have a second resonance frequency and a second antiresonance frequency, and a resonator having third frequency characteristics may have a third resonance frequency and a third antiresonance frequency.

Figure 6A:
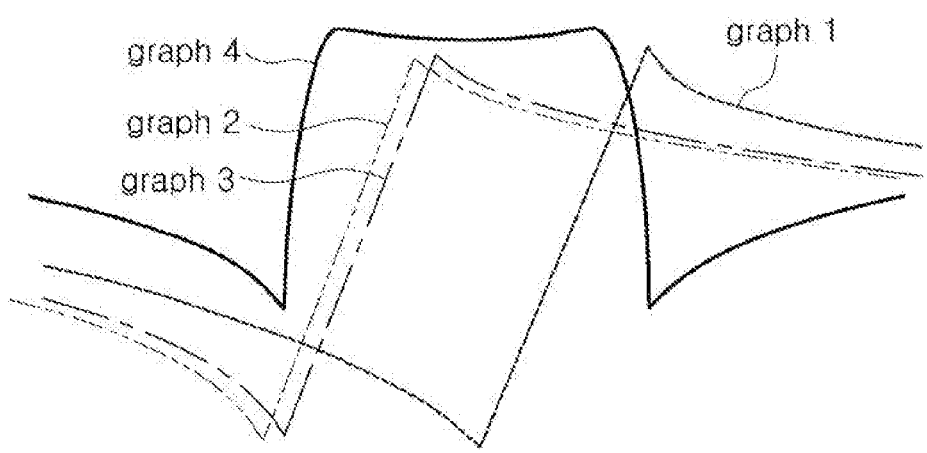
FIG. 6A is a graph illustrating a frequency response of a series resonator having frequency characteristics different from frequency characteristics of other series resonators in a filter, according to an embodiment.

FIG. 6A is a graph illustrating a frequency response of a third series resonator SE3 having frequency characteristics different from frequency characteristics of other series resonators SE1, SE2, and SE4 in a filter, according to an embodiment.

Referring to FIG. 6A, a first graph (graph 1) illustrates a frequency response (Z, Impedance) of the first series resonator SE1, the second series resonator SE2, and the fourth series resonator SE4, having first frequency characteristics, a second graph (graph 2) illustrates a frequency response (Z, Impedance) of shunt resonators SH1 to SH4, having second frequency characteristics, a third graph (graph 3) illustrates a frequency response (Z, Impedance) of the third series resonator SE3, having third frequency characteristics, and a fourth graph (graph 4) illustrates a frequency response (S-parameter) by a filter including the series resonators SE1 to SE4 (of which the third series resonator SE3 has different frequency characteristics) and the shunt resonators SH1 to SH4.

Referring to FIG. 6A, the third series resonator SE3 having the third frequency characteristics may have frequency characteristics similar to those of the shunt resonators SH1 to SH4 having the second frequency characteristics. As an example, resonance and antiresonance frequencies of the third series resonator SE3 may be respectively located within a reference frequency range of resonance and antiresonance frequencies of the shunt resonators SH1 to SH4.

As an example, the resonance and the antiresonance frequencies of the third series resonator SE3 may be respectively higher than the resonance and the antiresonance frequencies of the shunt resonators SH1 to SH4 having second frequency characteristics by 0 to 142 MHz.

When a resonance frequency of the shunt resonators SH1 to SH4 is 4298 MHz, a resonance frequency of the third series resonator SE3 may be 4298 MHz to 4400 MHz, preferably 4343 MHz. A resonance frequency of the third series resonator SE3 may be located between 4298 MHz, corresponding to resonance frequencies of the plurality of shunt resonators SH1 to SH4, and 4400 MHz, corresponding to a lower limit frequency of the filter including the series resonators SE1 to SE4 and the shunt resonators SH1 to SH4.

Referring to the filer 200 of FIG. 5A, a trimming inductor LSE is connected to the third series resonator SE3, having the third frequency characteristics, in parallel. As a result of the trimming inductor LSE being connected to the third series resonator SE3 in parallel, an antiresonance frequency of the third series resonator SE3 is moved to the right, in comparison to an example in which the trimming inductor LSE is not included. As an inductance of a trimming inductor connected to a series resonator is reduced, an antiresonance frequency of a series resonator moves to the right.

Figure 6B:
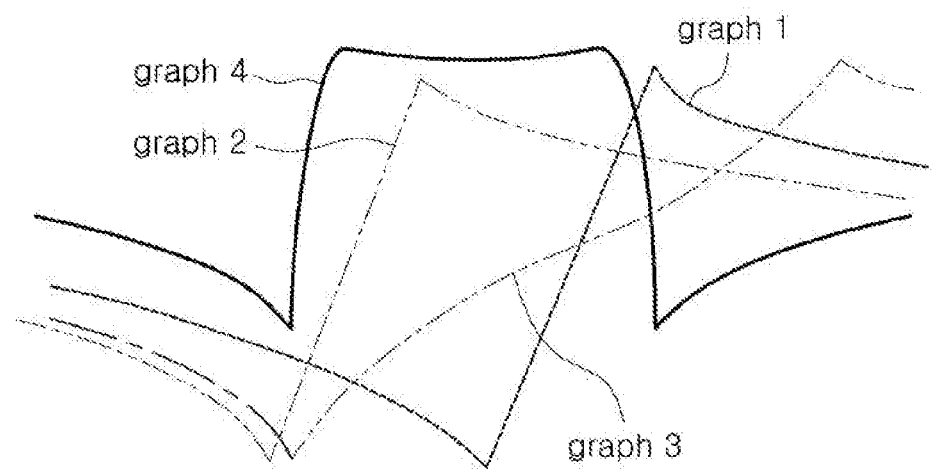
FIG. 6B is a graph illustrating a frequency response of the filter according to the embodiment of FIG. 5A.

FIG. 6B is a graph illustrating a frequency response of the filter 200 of FIG. 5A, according to an embodiment. That is, FIG. 6B is a graph illustrating a change in the frequency response, in comparison to the filter represented by FIG. 6A, when a trimming inductor is connected to the series resonator SE3.

Comparing FIG. 6A with FIG. 6B, when the trimming inductor LSE is connected to the third series resonator SE3 in parallel, an antiresonance frequency of the third series resonator SE3 moves to the right, as shown in FIG. 6B, so the antiresonance frequency is located outside of a passband, above an upper limit frequency of the passband. The antiresonance frequency of the third series resonator SE3 is higher than the antiresonance frequency of the shunt resonators SH1 to SH4.

According to an embodiment, due to the antiresonance frequency of the third series resonator SE3 being located above an upper limit frequency of the passband, and the resonance frequency of the third series resonator SE3 located at the same level as or below a lower limit frequency of the passband, an inductance component is provided to the passband, so a sufficient return loss may be provided. The trimming inductor LSE forms an additional attenuation band with a self-capacitor of the third series resonator SE3, thereby further improving attenuation characteristics.

In the embodiment of FIG. 5A described above, it is described that the third series resonator SE3 has third frequency characteristics, and the trimming inductor LSE is connected to the third series resonator SE3 in parallel. However, the number of series resonators having third frequency characteristics, and to which a trimming inductor LSE is connected in parallel, may be changed. As an example, referring to the filter 300 of FIG. 5B, in addition to the third series resonator SE3 having the third frequency characteristics, the second series resonator SE2 may have the third frequency characteristics, and another trimming inductor LSE is connected to the second series resonator SE2 in parallel.

Figure 7A:
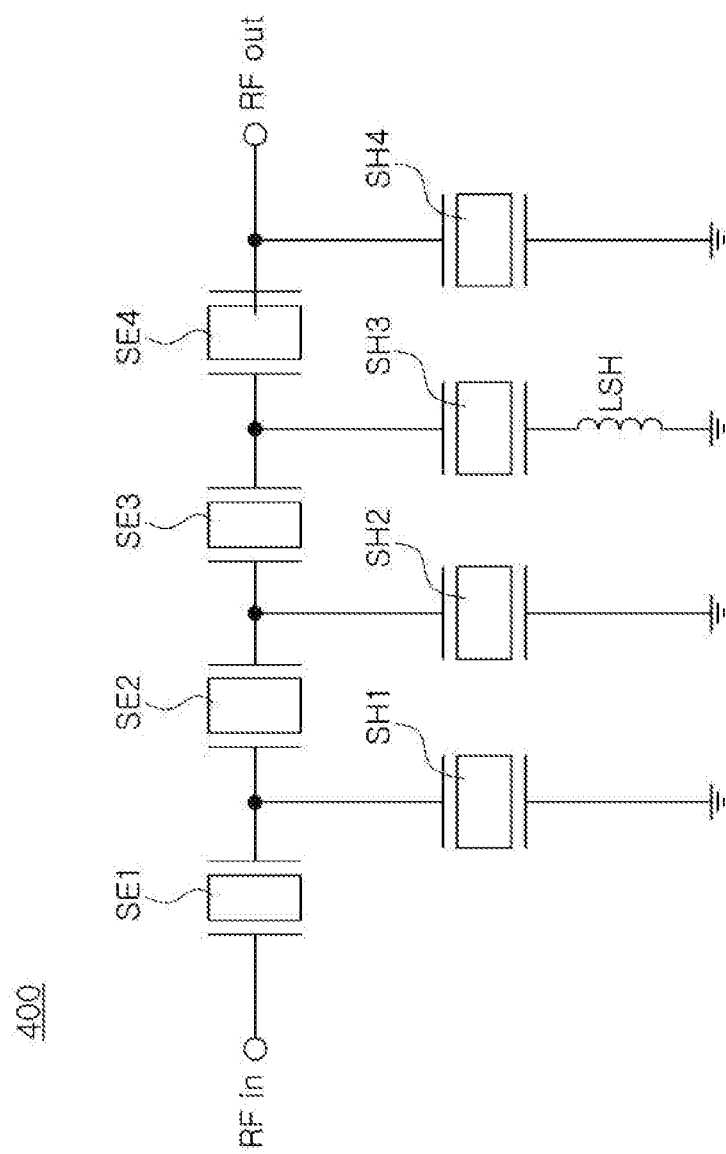
FIGS. 7A and 7B are circuit diagrams of a filters, according to embodiments.
Figure 7B:
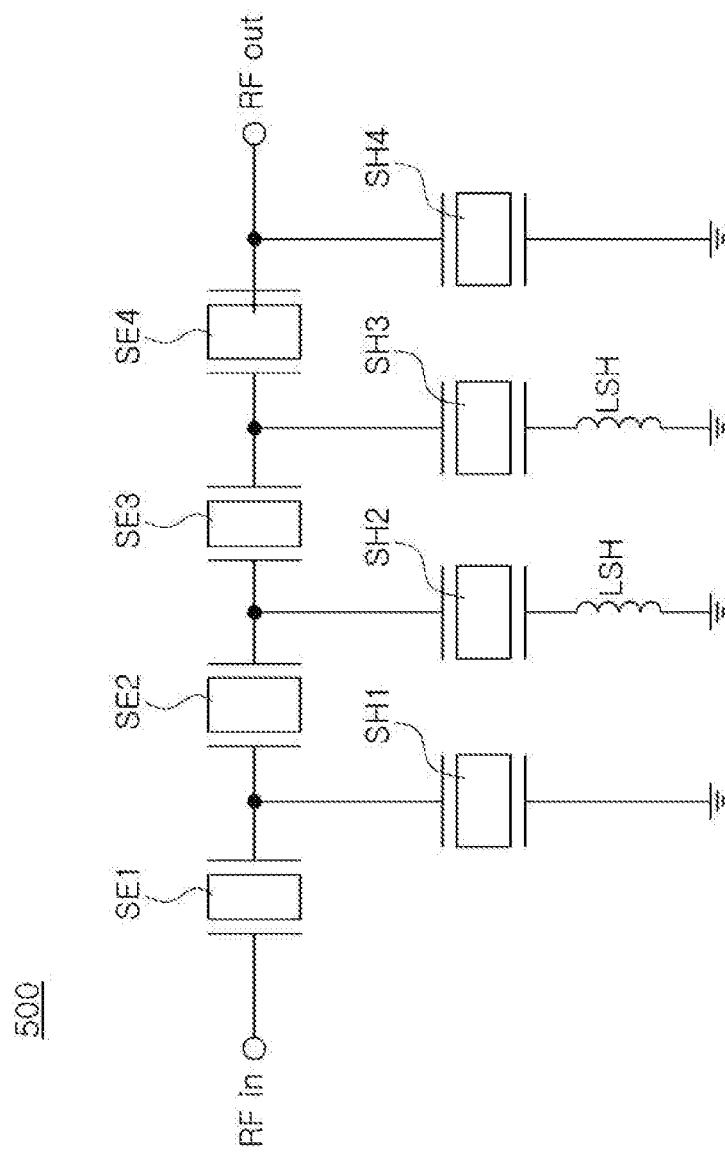

FIGS. 7A and 7B are circuit diagrams of filters 400 and 500, according to embodiments. The filters 400 and 500 according to the embodiments of FIGS. 7A and 7B are similar to the filters 200 and 300 according to the embodiments of FIGS. 5A and 5B. Thus, redundant descriptions will be omitted and differences present in the filters 400 and 500 will be mainly described.

Referring to the filter 400 of FIG. 7A, series resonators SE1 to SE4 may have first frequency characteristics. A portion (e.g., one or more) of shunt resonators SH1 to SH4 may have second frequency characteristics, while another portion of shunt resonators SH1 to SH4 may have frequency characteristics different from the second frequency characteristics. Hereinafter, for convenience of explanation, it is assumed that the first shunt resonator SH1, the second shunt resonator SH2, and the fourth shunt resonator SH4 have the second frequency characteristics, while the third shunt resonator SH3 has fourth frequency characteristics different from the second frequency characteristics.

Figure 8A:
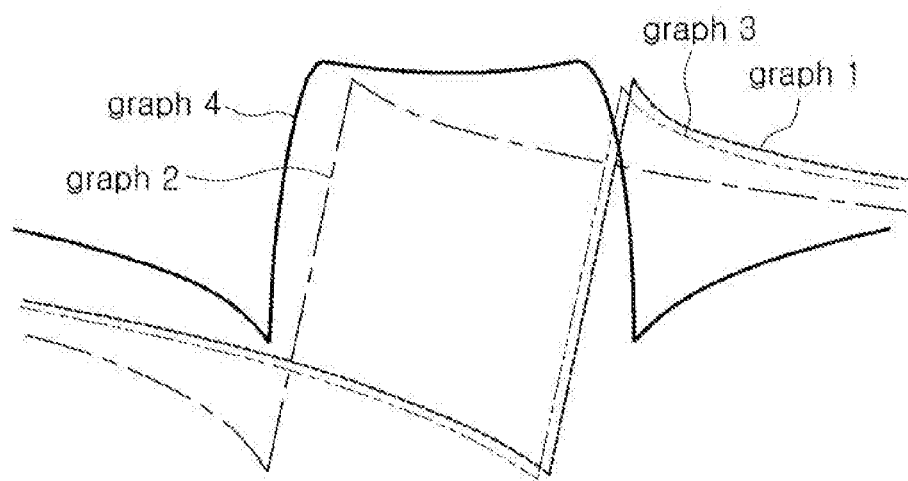
FIG. 8A is a graph illustrating a frequency response of a shunt resonator having frequency characteristics different from frequency characteristics of other shunt resonators in a filter, according to an embodiment.

FIG. 8A is a graph illustrating a frequency response of a third shunt resonator SH3 having frequency characteristics different from frequency characteristics of other shunt resonators SH1, SH2, and SH4 in a filter, according to an embodiment.

A first graph (graph 1) illustrates series resonators SE1 to SE4, having first frequency characteristics, a second graph (graph 2) illustrates a frequency response (Z, Impedance) of the first shunt resonator SH1, the second shunt resonator SH2, and the fourth shunt resonator SH4, having second frequency characteristics, a third graph (graph 3) illustrates a frequency response (Z, Impedance) of the third shunt resonator SH3 having fourth frequency characteristics, and a fourth graph (graph 4) illustrates a frequency response (S-parameter) by a filter including the series resonators SE1 to SE4 and the shunt resonators SH1 to SH4 (of which the third shunt resonator SH3 has different frequency characteristics).

Referring to FIG. 8A, the third shunt resonator SH3 having the fourth frequency characteristics may have frequency characteristics similar to those of the series resonators SE1 to SE4 having first frequency characteristics. As an example, resonance and antiresonance frequencies of the third shunt resonator SH3 may be respectively located within a reference frequency range of resonance and antiresonance frequencies of the series resonators SE1 to SE4.

As an example, the resonance and antiresonance frequencies of the third shunt resonator SH3 may be respectively lower than the resonance and antiresonance frequencies of the series resonators SE1 to SE4 by 0 to 269 MHz.

When a resonance frequency of the series resonators SE1 to SE4 is 4969 MHz, a resonance frequency of the third shunt resonator SH3 may be 4700 MHz to 4969 MHz, preferably 4805 MHz. A resonance frequency of the third shunt resonator SH3 may be located between 4700 MHz, corresponding to a center frequency of the filter including the series resonators SE1 to SE4 and the shunt resonators SH1 to SH4, and 4969 MHz, corresponding to a resonance frequency of the series resonators SE1 to SE4.

Referring to the filter 400 of FIG. 7A, a trimming inductor LSH is connected to the third shunt resonator SH3, having the fourth frequency characteristics, in series. The trimming inductor LSH is connected to the third shunt resonator SH3 in series, and thus a resonance frequency of the third shunt resonator SH3 is move to the left in comparison to an example in which the trimming inductor LSH is not included. As an inductance of a trimming inductor connected to a shunt resonator, increases, a resonance frequency of a shunt resonator moves to the left.

Figure 8B:
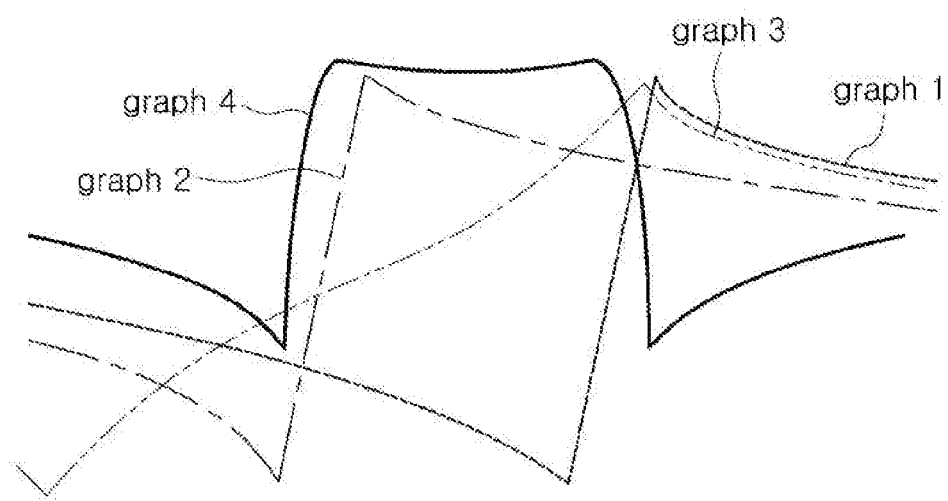
FIG. 8B is a graph illustrating a frequency response of the filter according to the embodiment of FIG. 7A.

FIG. 8B is a graph illustrating a frequency response of the filter 400 of FIG. 7A, according to an embodiment. That is, FIG. 8B is a graph illustrating a change in the frequency response, in comparison to the filter represented by FIG. 8A, when a trimming inductor is connected to the shunt resonator SH3.

Comparing FIG. 8A with FIG. 8B, when the trimming inductor LSH is connected to the third shunt resonator SH3 in series, a resonance frequency of the third shunt resonator SH3 moves to the left, as shown in FIG. 8B, so the resonance frequency of the third shunt resonator SH3 is located outside of a passband, below a lower limit frequency of the passband. The resonance frequency of the third shunt resonator SH3 is lower than the resonance frequency of the series resonators SE1 to SE4.

According to an embodiment, due to the resonance frequency of the third shunt resonator SH3 being located below a lower limit frequency of the passband, and the antiresonance frequency of the third shunt resonator SH3 being located higher than an upper limit frequency of the passband, an inductance component is provided to the passband, so that a sufficient return loss may be provided. The trimming inductor LSH forms an additional attenuation band with a self-capacitor of the third shunt resonator SH3, thereby further improving attenuation characteristics.

In the embodiment of FIG. 7A described above, it is described that the third shunt resonator SH3 has fourth frequency characteristics, and the trimming inductor LSH is connected to the third shunt resonator SH3 in series. However, the number of shunt resonators having fourth frequency characteristics, and to which a trimming inductor LSH is connected in series, may be changed. As an example, referring to the filter 500 of FIG. 7B, in addition to the third shunt resonator SH3 having the fourth frequency characteristics, the second shunt resonator SH2 may have the fourth frequency characteristics, and another trimming inductor LSH is connected to the second shunt resonator SH2 in series.

Figure 9:
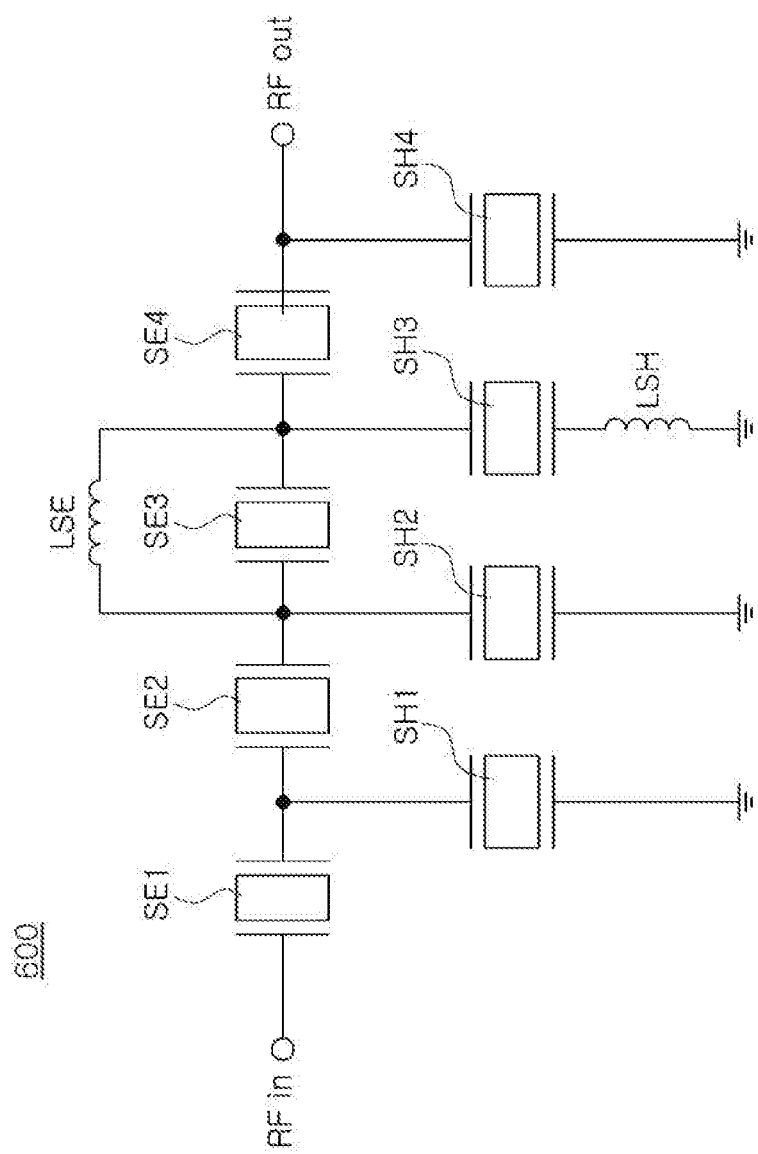
FIG. 9 is a circuit diagram of a filter, according to an embodiment.

FIG. 9 is a circuit diagram of a filter 600, according to an embodiment.

The filter 600 corresponds to a combination of the filter 200 according to the embodiment of FIG. 5A and the filter 400 according to the embodiment of FIG. 7A, and therefore a detailed description of the filter 600 will be omitted.

The filter 600 provides an inductance component to a passband using the third series resonator SE3 having the third frequency characteristics, and to which the trimming inductor LSE is connected in parallel, and the third shunt resonator SH3 having the fourth frequency characteristics, and to which the trimming inductor LSH is connected in series, thereby further improving return loss characteristics.

Figure 10:
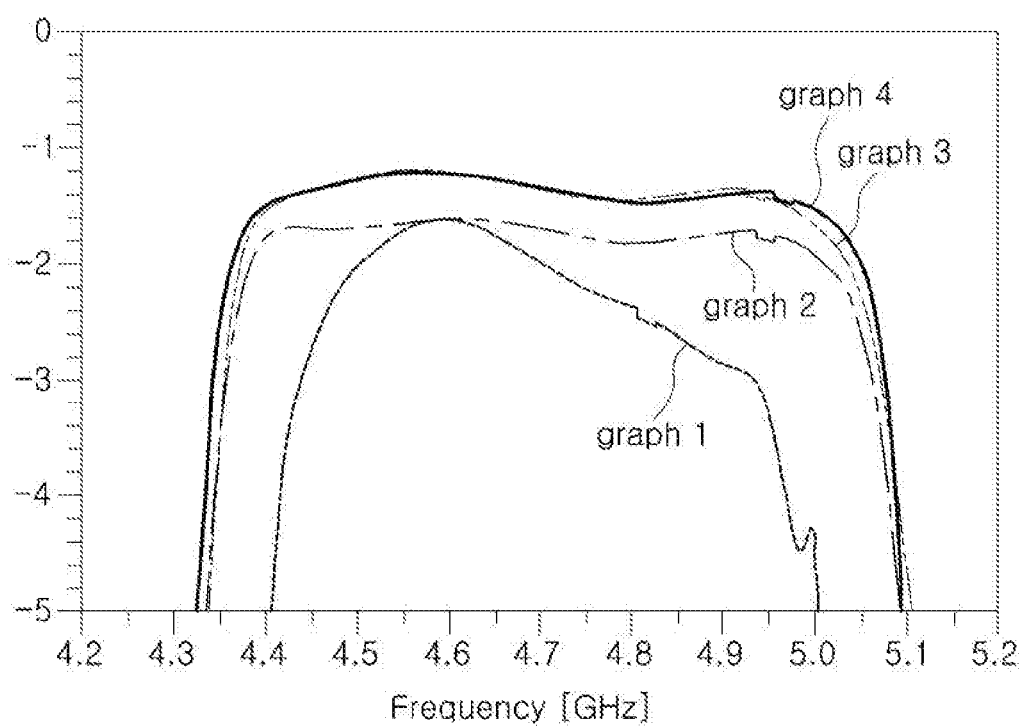
FIG. 10 illustrates simulation data, according to an embodiment.

FIG. 10 illustrates simulation data, according to an embodiment.

In FIG. 10, a first graph (graph 1) illustrates a frequency response of a comparative example in which a series resonator has first frequency characteristics, and a shunt resonator has second frequency characteristics, a second graph (graph 2) illustrates a frequency response of a filter according to the embodiment of FIG. 5A or a filter according to the embodiment of FIG. 7A, a third graph (graph 3) illustrates a frequency response of a filter according to the embodiment of FIG. 9, and a fourth graph (graph 4) illustrates a frequency response in an example in which a resonance frequency of the third series resonator SE3 is 4343 MHz, and a resonance frequency of the third shunt resonator SH3 is 4805 MHz, in the embodiment of FIG. 9.

Referring to the first graph (graph 1), it may be confirmed that an excessive insertion loss occurs, due to characteristics of a resonator in which a frequency interval between a resonance frequency and an antiresonance is narrow, for example, about 200 MHz. Referring to the second graph (graph 2), the second graph (graph 2) may secure a sufficient return loss as compared with the first graph (graph 1), due to the third series resonator SE3 having the third frequency characteristics, and having the trimming inductor LSE connected thereto in parallel, or the third shunt resonator SH3 having the fourth frequency characteristics, and having the trimming inductor LSH connected thereto in series.

In addition, referring to the third graph (graph 3), the insertion loss may be improved more effectively, by using both of the third series resonator SE3 having the third frequency characteristics, and having the trimming inductor LSE connected thereto parallel, and the third shunt resonator SH3 having the fourth frequency characteristics, and having the trimming inductor LSH connected thereto in series. Referring to the fourth graph (graph 4), pass characteristics may be improved by effectively improving insertion loss characteristics and return loss characteristics in a passband of about 4.4 GHz to 5.0 GHz, using a resonance frequency of the optimized third series resonator SE3 and a resonance frequency of the third shunt resonator SH3.

As set forth above, according to embodiments disclosed herein, a filter may improve insertion loss characteristics and return loss characteristics in a passband to implement broadband characteristics.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A filter, comprising:
    series resonators disposed between an input terminal and an output terminal; and
    shunt resonators disposed at different nodes between the input terminal and the output terminal,
    wherein:
        a resonance frequency difference between at least one series resonator among the series resonators and each of the shunt resonators is narrower than an antiresonance frequency difference between the at least one series resonator and each of other series resonators among the series resonators; or
        the resonance frequency difference between the at least one series resonator and each of the shunt resonators is narrower than a resonance frequency difference between the at least one series resonator and each of the other series resonators, and wherein an antiresonance frequency of the at least one series resonator is higher than an upper limit frequency of the filter.

2. The filter of claim 1, wherein a resonance frequency of the at least one series resonator is located between a resonance frequency of the shunt resonators and a lower limit frequency of the filter.

3. The filter of claim 2, wherein a difference between the resonance frequency and the antiresonance frequency of the at least one series resonator is equal to a difference between the resonance frequency of the shunt resonators and an antiresonance frequency of the shunt resonators.

4. The filter of claim 1, further comprising: a trimming inductor connected to the at least one series resonator in parallel.

5. The filter of claim 1, wherein the antiresonance frequency of the at least one series resonator is higher than an antiresonance frequency of each of the other series resonators.

6. The filter of claim 1, wherein a lower limit frequency of the filter is located between a resonance frequency of the shunt resonators and an antiresonance frequency of the shunt resonators, and the upper limit frequency of the filter is located between a resonance frequency of one of the other series resonators and an antiresonance frequency of the one of the other series resonators.

7. The filter of claim 1, wherein the filter has a passband of 4.4 GHz to 5.0 GHz.

8. A filter, comprising:
    series resonators disposed between an input terminal and an output terminal; and
    shunt resonators disposed at different nodes between the input terminal and the output terminal,
    wherein:
        an antiresonance frequency difference between at least one shunt resonator among the shunt resonators and each of the series resonators is narrower than a resonance frequency difference between the at least one shunt resonator and each of other shunt resonators among the shunt resonators; or
        the antiresonance frequency difference between the at least one shunt resonator and each of the series resonators is narrower than an antiresonance frequency difference between the at least one shunt resonator and each of the other shunt resonators, and wherein a resonance frequency of the at least one shunt resonator is below a lower limit frequency of the filter, and
    wherein the lower limit frequency of the filter is located between a resonance frequency and an antiresonance frequency of another shunt resonator among the shunt resonators, and an upper limit frequency of the filter is located between a resonance frequency and an antiresonance frequency of the series resonators.

9. The filter of claim 8, wherein a difference between the resonance frequency of the series resonators and the antiresonance frequency of the series resonators is equal to a difference between the resonance frequency of the at least one shunt resonator and an antiresonance frequency of the at least one shunt resonator.

10. The filter of claim 8, further comprising: at least one trimming inductor connected to the at least one shunt resonator in series.

11. The filter of claim 8, wherein the resonance frequency of the at least one shunt resonator is lower than the resonance frequency of the series resonators.

12. The filter of claim 8, wherein the filter has a bandwidth of 400 MHz to 800 MHz.

13. A filter, comprising:
series resonators disposed between an input terminal and an output terminal; and
shunt resonators disposed at different nodes between the input terminal and the output terminal,
wherein:
an antiresonance frequency difference between at least one shunt resonator among the shunt resonators and each of the series resonators is narrower than a resonance frequency difference between the at least one shunt resonator and each of other shunt resonators among the shunt resonators; or
the antiresonance frequency difference between the at least one shunt resonator and each of the series resonators is narrower than an antiresonance frequency difference between the at least one shunt resonator and each of the other shunt resonators, and
wherein a resonance frequency of the at least one shunt resonator is below a lower limit frequency of the filter, and
wherein a difference between a resonance frequency of the series resonators and an antiresonance frequency of the series resonators is equal to a difference between the resonance frequency of the at least one shunt resonator and an antiresonance frequency of the at least one shunt resonator.

14. The filter of claim 13, further comprising: at least one trimming inductor connected to the at least one shunt resonator in series.

15. The filter of claim 13, wherein the resonance frequency of the at least one shunt resonator is lower than the resonance frequency of the series resonators.

16. The filter of claim 13, wherein the filter has a bandwidth of 400 MHz to 800 MHz.

* * * * *